US 9,532,458 B2

(12) United States Patent
Shocket et al.

(10) Patent No.: US 9,532,458 B2
(45) Date of Patent: Dec. 27, 2016

(54) ELECTRICAL ASSEMBLY WITHIN A CONNECTOR HOUSING

(71) Applicant: Tyco Electronics Corporation, Berwyn, PA (US)

(72) Inventors: Abraham L. Shocket, Cary, NC (US); Lyle S. Bryan, Kernersville, NC (US); John S. Cowan, Winston Salem, NC (US); Kevin J. Peterson, Kernersville, NC (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 0 days.

(21) Appl. No.: 14/543,089

(22) Filed: Nov. 17, 2014

(65) Prior Publication Data

US 2016/0143179 A1    May 19, 2016

(51) Int. Cl.
| | |
|---|---|
| H01R 12/70 | (2011.01) |
| H05K 1/18 | (2006.01) |
| H05K 1/02 | (2006.01) |
| H05K 5/00 | (2006.01) |
| H05K 7/20 | (2006.01) |
| H01R 12/51 | (2011.01) |

(52) U.S. Cl.
CPC .......... *H05K 1/181* (2013.01); *H05K 1/0203* (2013.01); *H05K 5/0069* (2013.01); *H05K 7/20854* (2013.01); *H01R 12/515* (2013.01); *H05K 2201/10287* (2013.01); *H05K 2201/10356* (2013.01); *H05K 2201/10537* (2013.01)

(58) Field of Classification Search
CPC ...... H05K 7/205; H05K 5/0034; H05K 1/181; H05K 5/0247
See application file for complete search history.

(56) References Cited

U.S. PATENT DOCUMENTS

| | | | | |
|---|---|---|---|---|
| 6,955,572 | B1* | 10/2005 | Howell | H01R 13/2442 439/862 |
| 8,113,385 | B2* | 2/2012 | Choiniere | B05B 9/007 222/1 |
| 8,882,546 | B2* | 11/2014 | Machado | H01R 13/514 439/541.5 |
| 2008/0266810 | A1 | 10/2008 | Tiedemann et al. | |
| 2012/0021657 | A1* | 1/2012 | Nagasaki | H01R 4/2404 439/775 |
| 2014/0049292 | A1* | 2/2014 | Popescu | G02B 6/43 327/100 |

FOREIGN PATENT DOCUMENTS

| | | |
|---|---|---|
| EP | 1 032 250 A2 | 8/2000 |
| EP | 2 224 798 A1 | 9/2010 |

OTHER PUBLICATIONS

International Search Report, International Application No. PCT/US2015/059246, International Filing Date, Nov. 5, 2015.

* cited by examiner

*Primary Examiner* — Long Pham

(57) ABSTRACT

An electrical assembly configured to be fixed in a housing of an electrical connector includes an electrical package disposed on a substrate and electrically connected to the substrate. The electrical assembly also includes a conductor terminated to the substrate at a spaced apart location from the electrical package to provide at least one of power or control signals to the substrate. A terminating segment of the conductor is thermally coupled to the electrical package to receive heat generated at the electrical package and dissipate the heat through the conductor away from the electrical package.

20 Claims, 4 Drawing Sheets

ELECTRICAL ASSEMBLY WITHIN A CONNECTOR HOUSING

BACKGROUND OF THE INVENTION

The subject matter herein relates generally to electrical assemblies within connector housings.

New semiconductor products include electronic components that perform various functions, such as measurement sensing, motor control, information processing, information storage, communication, and the like. These electronic components may be embedded into silicon chips that are small enough to fit into tight cavities of devices, such as motors and connectors. These semiconductor products have the ability to transform an ordinary motor, for example, into a "smart" motor with additional functions beyond the traditional function of supplying power. These semiconductor products may also be disposed in the housing of an electrical connector used for connecting electrical devices, such as a motor to a power source and/or controller.

These smart devices consolidate functions traditionally performed by multiple devices into a single structure, which reduces space requirements and costs associated with manufacturing, assembling, and repairing additional devices. However, replacing a smart device, such as a motor, could be more costly than a traditional "dumb" motor due to the extra semiconductor circuitry present in the smart motor. Since motors generally tend to break or die well before the electrical connectors associated with the motors, it may be preferable to install the intelligence (e.g., semiconductors and circuitry) into the housing of an electrical connector instead of into a motor housing. Therefore, a smart electrical connector may be connected to a regular dumb motor, which allows the motor to be replaced while the extra circuitry remains within the connector housing.

Due to the large amount of circuitry that may be packed into a single silicon chip, the performance of some functions generates significant heat. For example, the semiconductor chip may generate heat when switched from "off" to "on," and/or the reverse, due to a voltage spike known as over shoot and/or under shoot. The generated heat may cause irreversible damage if the temperature exceeds a tolerable threshold. The heat may damage the chip itself, as well as a printed circuit board on which the chip is disposed, neighboring chips on the circuit board, neighboring circuit boards, and other electrical components of the electrical connector. It is important to remove heat so the temperature of the chip stays in the tolerable range below the threshold, especially for products that operate in high ambient temperatures, such as various automotive applications. There are numerous methods in the prior art for passive and active thermal management of electric circuits. However, prior methods do not manage heat in a way that minimizes cost and space, such as to allow for cheap integration into the hardware of a "smart" electrical connector.

A need remains for an electrical assembly with electronic processing components small enough to be located within a connector housing that provides effective thermal dissipation of heat from the electrical assembly without significant added costs and components.

BRIEF DESCRIPTION OF THE INVENTION

In an exemplary embodiment, an electrical assembly configured to be fixed in a housing of an electrical connector includes an electrical package disposed on a substrate and electrically connected to the substrate. The electrical assembly also includes a conductor terminated to the substrate at a spaced apart location from the electrical package to provide at least one of power or control signals to the substrate. A terminating segment of the conductor is thermally coupled to the electrical package to receive heat generated at the electrical package and dissipate the heat through the conductor away from the electrical package.

In an exemplary embodiment, an electrical assembly configured to be fixed in a housing of an electrical connector includes an electrical package disposed on a substrate and electrically coupled to the substrate. The electrical assembly also includes a terminal terminated to a cable. The terminal has a mating end configured to electrically connect to the substrate at a spaced apart location from the electrical package to provide at least one of power or control signals to the substrate from the cable. A terminating segment of the terminal is thermally coupled to the electrical package to receive heat generated at the electrical package and dissipate the heat through the cable away from the electrical package.

In an exemplary embodiment, an electrical assembly configured to be disposed in a housing of an electrical connector includes a semiconductor chip disposed on a printed circuit board and electrically connected to the printed circuit board. The electrical assembly also includes a conductor directly electrically connected to the printed circuit board at a spaced apart location from the semiconductor chip to provide at least one of power or control signals to the printed circuit board. The semiconductor chip is indirectly electrically connected to the conductor via the printed circuit board. A terminating segment of the conductor is thermally coupled to the semiconductor chip to receive heat generated at the semiconductor chip and dissipate the heat through the conductor away from the semiconductor chip.

DETAILED DESCRIPTION OF THE INVENTION

One or more embodiments of the inventive subject matter described herein provide systems for improved thermal control of heat generated by electrical packages in housings of devices, such as electrical connectors.

Figure 1:
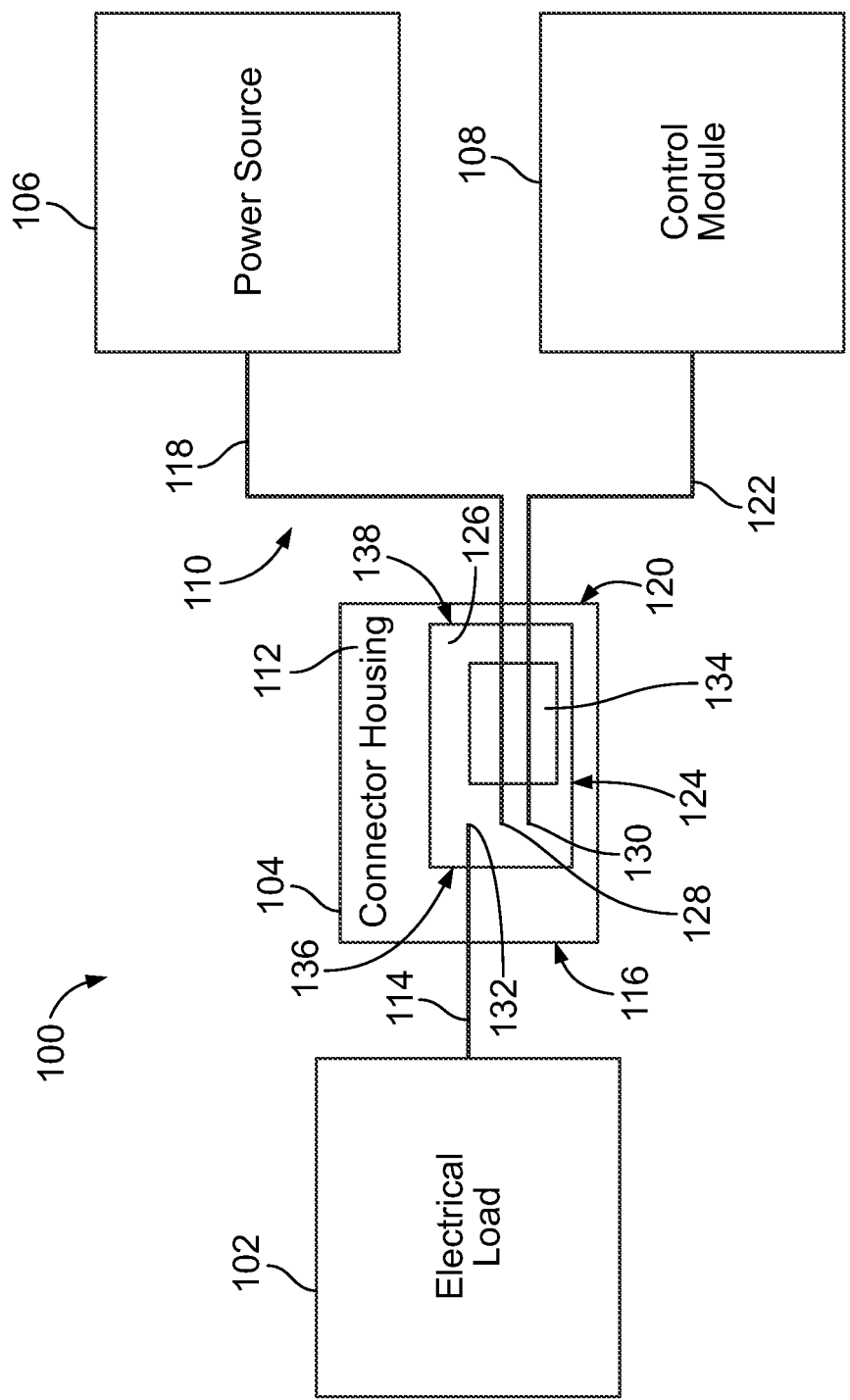
FIG. 1 is a schematic block diagram of an electrical system formed in accordance with an exemplary embodiment.

FIG. 1 is a schematic block diagram of an electrical system 100 formed in accordance with an exemplary embodiment. The electrical system 100 may be configured to provide power and/or control signals to an electrical load 102 through a connector 104. The electrical load 102 may be a motor, a generator, a resistor, and/or the like that is supplied electrical power to operate. For example, the electrical load 102 may receive power to lock an automatic door lock and/or adjust the height of a window in an automobile. In an alternative embodiment, the connector 104 may be connected to a different type of electrical component or device, such as a processor, a memory storage device, a sensor, and the like. At least some of the embodiments described herein relate to the electrical load 102 being a motor and may refer to the motor 102. The electrical system 100 may be used in various industries, including the automotive and household appliance industries. For example, the electrical system 100 may represent the components used to raise or lower a power window or to adjust a power seat in an automobile.

The power signals supply an electrical current to the motor 102 to allow the motor to provide motive power. The power signals are generated by a power source 106, such as a battery or a generator. The control signals control the output of the motor 102, such as speed, timing, etc., and are provided by a control module 108. The control module 108 may include a logic-based processor or microcontroller with associated circuitry that performs operations based on hardwired logic and/or instructions stored on a tangible and non-transitory computer readable storage medium. In an embodiment, the control module 108 may be an engine control unit (ECU). The control module 108 optionally may be connected to a user input device (not shown), to receive user-generated commands.

The power and/or control signals in the electrical system 100 may be communicated over a communication network or bus 110. The communication bus 110 may include conductors, such as cables, wires, and the like, that provide a conductive path between the connector 104, power source 106, control module 108, and/or load 102.

In an embodiment, the connector 104 receives the power and/or control signals from the respective power source 106 and control module 108 over the communication bus 110, and conveys the signals to the motor 102. The connector 104 includes a connector housing 112 which houses additional components of the connector system 100. The connector housing 112 may be directly attached to the housing of the motor 102 or may be connected to the motor 102 by a conductor 114, as shown in FIG. 1. The conductor 114 may be a cable or wire terminated to a contact. The conductor 114 extends from a first side 116 of the connector housing 112. The power source 106 is connected to the connector 104 through a conductor 118 that extends from a second side 120 of the connector housing 112, which may be opposite the first side 116. The control module 108 is connected to the connector 104 via a conductor 122 that also extends from the second side 120 of the housing 112. Optionally, the conductors 118 and 122 may each be one or more wires that are received within a single cable jacket (not shown) before entering the connector housing 112. Within the connector housing 112, the conductors 118 and 122 may extend from the shared cable jacket to spaced-apart locations for mating to respective electrical contacts (not shown). In an exemplary embodiment, the conductors 114, 118, and/or 122 are thermally conductive and are used to dissipate heat from various components within the connector 104.

It should be noted that FIG. 1 is schematic in nature and intended by way of example. In various embodiments, various aspects or structures may be omitted, modified, or added. Further, various devices, systems, or other aspects may be combined. For example, the power source 106 and the control module 108 optionally may be combined into a common device housing. Yet further still, various devices or systems may be separated into sub-devices or sub-systems and/or functionality of a given device or system may be shared between or assigned differently to different devices or systems.

In an exemplary embodiment, the conductors 118 and 122 electrically couple to an electrical assembly 124 within the connector housing 112. The electrical assembly 124 includes a substrate 126. The substrate 126 may include a conductive layer above an insulated layer in order to provide interconnections to form an electric circuit. For example, the substrate 126 may be a printed circuit board. The substrate 126 is affixed to the connector housing 112. For example, the substrate 126 may be mounted to an interior wall (not shown) of the housing 112. The conductors 118 and 122 from the power source 106 and control module 108, respectively, may be terminated to the substrate 126, as well as the conductor 114 to the motor 102. For example, the conductors 118, 122, and 114 may be coupled to the substrate 126 at distal ends 128, 130, 132 of the conductors 118, 122, 114, respectively. The distal ends 128, 130, 132 may be through-hole mounted and/or soldered to the substrate 126. The distal ends 128, 130, 132 may have pins, contacts, terminals, and the like that are terminated to the substrate 126. In an embodiment, the conductors 118, 122, 114 are not mounted directly to the substrate 126 at any other location besides at the distal ends 128, 130, 132, respectively. Alternatively, rather than being terminated to the substrate 126, the conductors 114, 118, 122 may be terminated to a different component, such as to the motor 102.

The electrical assembly 124 also includes at least one electrical package 134 disposed on the substrate 126. The term "electrical package" as used herein may include a semiconductor microchip, chip, integrated circuit, block, and the like. The electrical package 134 may be composed at least partially of a semiconductor material, such as silicon or germanium. Circuit elements within the electrical package 134 may be inseparably associated and electrically interconnected in order to perform one or more defined functions. The electrical package 134 may be a controller or a field effect transistor (FET). The electrical package 134 may control the electrical load 102. For example, the electrical package 134 of the electrical assembly 124 may be a motor drive circuit configured to receive control signals from the control module 108 (e.g., engine control unit) and control the performance of the motor 102. For example, the electrical package 134 may start and stop the motor 102, select forward or reverse rotation of the motor 102, select and regulate the speed and/or torque of the motor 102, and/or protect against overloads and faults that could damage the motor 102 and/or the associated circuitry. The electrical package 134 may generate significant heat during while performing its tasks.

The electrical package 134 may be mounted on the substrate 126 and directly electrically connected to the substrate 126 such that the electrical package 134 sends and receives power and/or control signals through conductive paths or traces (not shown) on the substrate 126. For example, power signals may be transmitted from the power source 106 via the conductor 118 and received by the substrate 126 at the distal end 128 of the conductor 118. Thereafter, the power signals may be conducted through various traces on the substrate 126, and at least some power signals are received by the electrical package 134 to power the processing circuitry of the package 134. Control signals from the control module 108 may be transmitted to the electrical package 134 along a similar route through the conductor 122 to the substrate 126 and then to the electrical package 134. It is noted that, in an exemplary embodiment, the conductors 118, 122, and/or 114 are indirectly electrically connected to the electrical package 134 through the substrate 126, so none of the conductors 118, 122, 114 are directly electrically connected to the electrical package 134. In order to send power and/or control signals from the electrical package 134 (e.g., motor drive circuit) to the electrical load 102 (e.g., motor), the signals are conveyed through conductive traces along the substrate 126 to the conductor 114 through the distal end 132 of the conductor 114. The signals thereafter propagate through the conductor 114 to the motor 102 to control the output of the motor 102.

In an exemplary embodiment, the conductors 118 and 122 enter the connector housing 112 through the second side 120 and extend across the electrical package 134 on the substrate 126 before mounting to the substrate 126 on the other side of the electrical package 134. For example, the substrate 126 has a first edge 136 and a second edge 138 that mirror the first and second sides 116, 120, respectively, of the connector housing 112. The distal ends 128, 130 of the conductors 118, 122, respectively, mount to the substrate 126 at locations between the first edge 136 and the electrical package 134. Additionally, the conductors 118, 122 extend from the mounting locations towards the second edge 138 of the substrate 126 such that at least one of the conductors 118, 122 pass over the electrical package 134. In the illustrated embodiment, both conductors 118, 122 extend across the electrical package 134 before exiting the second side 120 of the connector housing 112. Optionally, the conductor 114 may be mounted to the substrate 126 between the electrical package 134 and the first edge 136 of the substrate 126. Alternatively, the conductor 114 may be mounted between the electrical package 134 and the second edge 138 of the substrate 126, and the conductor 114 may also be positioned to extend across the electrical package 134 before exiting the first side 116 of the connector housing 112. In an alternative embodiment, the conductor 114 may extend across the electrical package 134, while the conductor 118 and/or conductor 122 do not extend across the electrical package 134.

It should be noted that FIG. 1 is schematic in nature and intended by way of example. In various embodiments, each of the conductors 114, 118, and/or 122 may include one or more conductive wires or cables terminated to a terminal. For example, the conductor 114 may include multiple wires that convey power and/or control signals, although the conductor 114 is only represented by a single line in FIG. 1. Similarly, although conductors 118 and 122 are shown as two separate lines in FIG. 1, the conductors 118 and 122 may be combined to include less than, the same as, or more wires or cables than the conductor 114 to the motor 102.

The electrical package 134 may generate heat during routine operations. The heat generated may be significant. Since the electrical assembly 124 is located within a connector housing 112, the generated heat may be emitted from the electrical package 134 into the housing 112, where the heat may be relatively contained within an interior of the housing 112. For example, the housing 112 of the connector 104 may define a small volume of air and be designed with few to no external openings (e.g., when mated to a mating connector) in order to protect the internal electrical components from electrical interference and/or contaminants, such as sand, dirt, and liquids. The heat may fill the small interior volume of the housing 112, raising the internal temperature of the connector 104, since there is insufficient airflow through the housing 112 to dissipate the heat and cool the electrical package 134. If the temperature exceeds a given threshold, the heat may cause irreparable damage to the electrical package 134, the substrate 126, the conductors 114, 118, 122, and/or other components of the connector 104.

In an exemplary embodiment, the heat generated by the electrical package 134 may be dissipated from the connector housing 112, at least partially, through one or more of the conductors 114, 118, 122. For example, the conductors 114, 118, 122 may be composed of material that is thermally conductive as well as electrically conductive, such that the conductors 114, 118, 122 may be configured to absorb heat and conduct the heat along the length of the conductors 114, 118, 122. In the illustrated embodiment, at least some of the heat generated by the electrical package 134 may be absorbed by the conductors 118, 122 that extend across the electrical package 134. The conductors 118, 122 may directly physically contact a surface of the electrical package 134 or may be proximate to, but not in direct physical contact with, the electrical package 134, such that the conductors 118, 122 are thermally coupled to the package 134. For example, the conductors 118, 122 may be separated from the electrical package 134 by a thermal interface positioned between the conductors 118, 122 and the package 134. The heat may be absorbed by wires and/or cables within the conductors 118, 122. The heat may be conveyed along the lengths of the conductors 118, 122, where the heat is dissipated from the conductors 118, 122. For example, the heat may be conveyed along the conductors 118, 122 through the second side 120 of the electrical housing 112 in the direction towards the power source 106 and/or control module 108. The heat dissipates from the conductors 118, 122 along the route such that minimal, if any, heat is received at the power source 106 and/or control module 108.

The absorption and conveyance of at least some of the heat generated by the electrical package 134 by the electrical conductors 118, 122 may effectively remove the heat from the connector housing 112. As a result, the connector housing 112 is cooled, reducing the internal temperature. Thus, the internal temperature is prevented from exceeding the threshold that may damage the internal electrical components. It is noted that while the conductors 114, 118, 122 are not directly electrically connected to the electrical package 134, such conductors 114, 118, 122 may be directly thermally coupled to the electrical package 134. In an exemplary embodiment, the electrical conductors 114, 118, and/or 122 are used for the dual purpose of signal transmission to and/or from the connector 104 as well as heat sinking members, effectively drawing heat out of the connector housing 112 to provide cooling.

Optionally, the electrical assembly 124 may include multiple electrical packages 134 disposed on the substrate 126. One or more of the conductors 114, 118, 122 may be configured to extend across and thermally engage each of the electrical packages 134.

Figure 2:
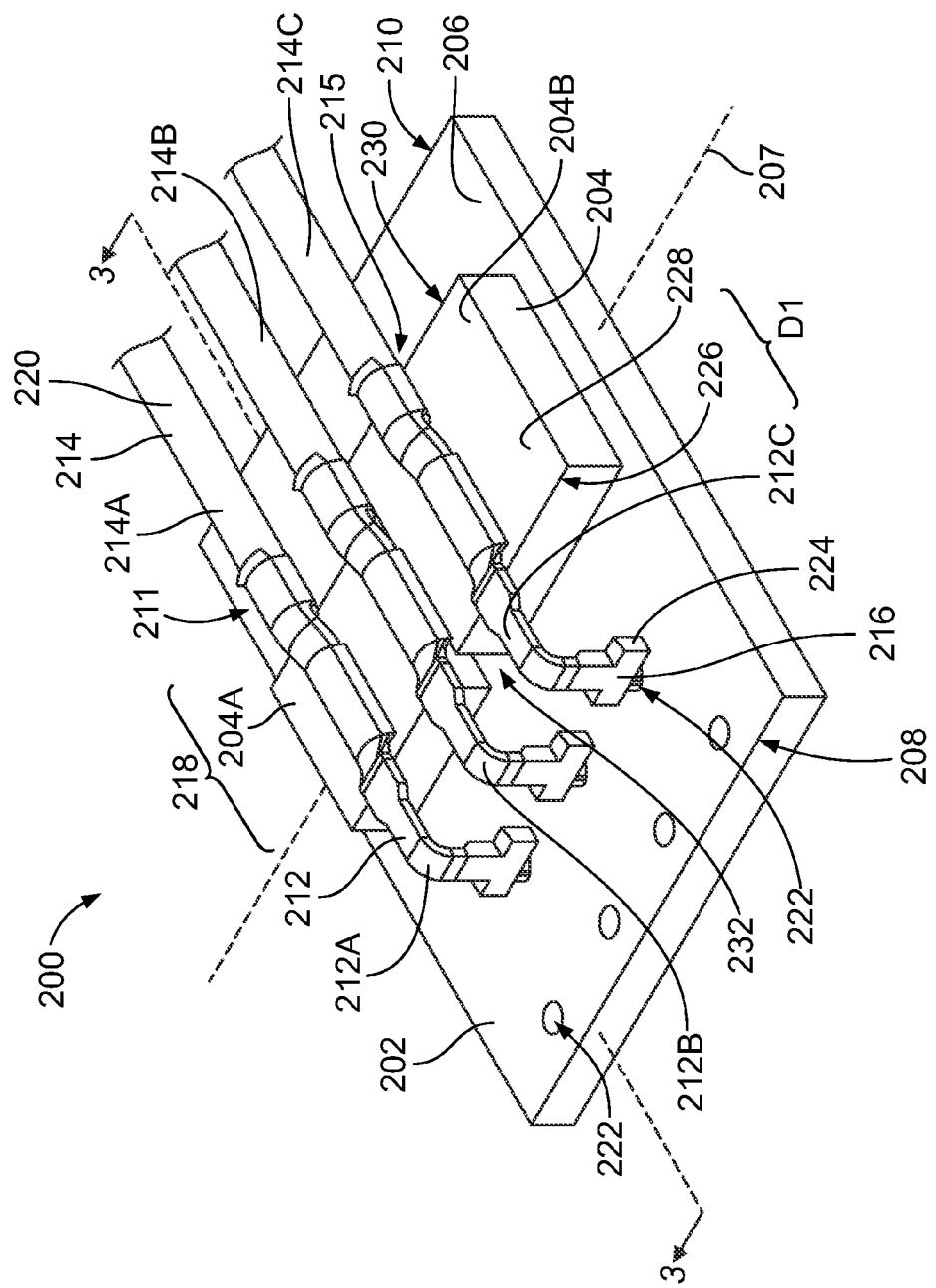
FIG. 2 is a perspective view of an electrical assembly according to an exemplary embodiment.

FIG. 2 is a perspective view of an electrical assembly 200 according to an exemplary embodiment. The electrical assembly 200 may be similar to the electrical assembly 124 shown in FIG. 1. The electrical assembly 200 may be configured to be disposed in the connector housing 112 of the electrical connector 104 shown in FIG. 1. The electrical assembly 200 includes a substrate 202 and at least one electrical package 204 disposed on and electrically engaged with the substrate 202. The substrate 202 may be a printed circuit board. In the illustrated embodiment, the electrical assembly 200 includes a first electrical package 204A and a second electrical package 204B. The electrical packages 204 may be semiconductor chips having sets of electronic circuits embedded thereon for performing one or more operations (e.g., based on hard-wired logic). Electrical package 204A optionally may be a controller while package 204B may be a field effect transistor (FET). The electrical packages 204A and 204B may perform different functions although both are disposed on the same substrate 202. For example, package 204A may be used for data processing while package 204B may be used for data storage or communication. Each of the electrical packages 204A, 204B may generate heat. The electrical packages 204 are electrically connected to the substrate 202. As used herein, "electrically connected" means conductively and/or inductively electrically coupled. Two components may be electrically connected via direct mechanical engagement (such that the components are conductively coupled) or via indirect inductive coupling without mechanical engagement. The electrical packages 204 receive power and/or control (e.g., data) signals from the substrate 202 and transmit power and/or control signals to the substrate 202.

The number and relative placement of the electrical packages 204 on a top surface 206 of the substrate 202 is optional and may depend on the desired functionality and circuitry. For example, in the illustrated embodiment, electrical packages 204A and 204B are generally aligned along an axis 207 that is parallel to a first edge 208 and a second edge 210 of the substrate 202. In an alternative embodiment, the electrical packages 204A and 204B may be aligned side-by-side along an axis (not shown) that is perpendicular to the first and second edges 208, 210 (e.g., and to the axis 207). Alternatively, the electrical packages 204A and 204B may be diagonally aligned or staggered out of alignment with a shared axis. Optionally, the electrical assembly 200 may include more or less than the two electrical packages 204A, 204B shown in FIG. 2.

The electrical assembly 200 includes at least one conductor 211. The conductor(s) 211 may be similar to one or more of the conductors 114, 118, 122 shown in FIG. 1. The conductor(s) 211 include a cable 214 and a terminal 212 coupled or terminated to an end 215 of the cable 214. In the illustrated embodiment, the electrical assembly 200 includes three conductors 211, including terminals 212A, 212B, and 212C and respective cables 214A, 214B, and 214C. Each terminal 212 has a mating end 216 configured to electrically connect to the substrate 202. The terminal 212 also has a terminating segment 218 that is configured to couple to the cable 214. The terminal 212 may be formed of a conductive material, such as copper or another metal. Optionally, the terminal 212 may be fabricated by stamping and forming a thin metal sheet into the desired shape.

The mating end 216 of each terminal 212 may be soldered and/or through-hole connected to the substrate 202 to terminate the terminal 212 to (e.g., and electrically engage) the substrate 202. For example, the mating end 216 may include a pin 302 (shown in FIG. 3) that extends into a defined hole 222 in the top surface 206 of the substrate 202. The pin 302 may be retained in the hole 222 by an interference fit or by soldering. Optionally, a horizontal bar 224 of the mating end 216 may be soldered to the top surface 206 of the substrate 202 to electrically engage and affix the terminal 212 to the substrate 202.

The cable 214 includes a center conductor 310 (shown in FIG. 3) and an outer sheath or jacket 220. The center conductor 310 is a conductive metal material, such as copper, and may include one or more coextending, intertwined, or braided wires. The outer jacket 220 may be formed of a dielectric material, such as a plastic polymer, to insulate electrical currents conducted along the center conductor 310. Optionally, the cable 214 may include one or more additional insulating and/or conductive layers between the center conductor 310 and the outer jacket 220.

In an embodiment, the cable 214 is received within the terminating segment 218 of the terminal 212, and the terminating segment 218 is terminated to the cable 214. The center conductor 310 of the cable 214 may be crimped and/or soldered to the terminating segment 218. For example, the terminating segment 218 of the terminal 212 may include one or more wings or arms (not shown) that are crimped around the center conductor 310 and/or the outer jacket 220 of the cable 214. Once crimped and/or soldered, the terminal 212 is both electrically and thermally engaged with the center conductor 310 of the cable 214.

The cable 214 may transmit power and/or control signals to and/or from the substrate 202. As used herein, cables that convey power signals may include positive wires, ground wires, and/or neutral wires. For example, cables 214A and 214B may both be power cables, with cable 214A being a positive or "hot" wire and cable 214B being a ground wire. In addition, cable 214C may include control wiring to communicate control signals to and/or from the substrate 202. Optionally, a fourth cable (not shown) may be used as a neutral power wire or an additional control cable. In alternative embodiments, the electrical assembly 200 may include more or less than the three cables 214A-214C shown in FIG. 2.

In an exemplary embodiment, electrical signals (e.g., for power and/or control) are conveyed by each cable 214 to the terminal 212 through the terminating segment 218. The electrical signals are further relayed along the terminal 212 to the substrate 202 through the mating end 216. The mating end 216 of each terminal 212 may be positioned at a spaced apart location from the electrical package(s) 204. For example, in the illustrated embodiment, the mating end 216 may electrically engage the substrate 202 at a location (e.g., a through-hole 222) between the first edge 208 of the substrate 202 and a first edge 226 of one of the electrical packages 204 (e.g., package 204B). The location is spaced apart from the first edge 226 by a distance D1. Once the electrical signals are conveyed through the mating end 216 to the substrate 202, the signals may propagate the distance D1 along defined conductive traces (not shown) on the top surface 206 of the substrate 202 to one or both of the electrical packages 204A, 204B to provide power and/or control (e.g., data) to the package(s) 204. As such, the terminal 212 indirectly provides at least one of power or control signals from the attached cable 214 to at least one electrical package 204 through the substrate 202. It is noted that, in an embodiment, the electrical signals are not conveyed directly from the terminal 212 to the electrical package 204. The same overall route may be reversed to send electrical signals from the electrical packages 204 to one or more external devices coupled to the cables 214. The external devices may be external to the connector housing 112 (shown in FIG. 1) in which the electrical assembly 200 is mounted.

In an exemplary embodiment, each terminal 212 may be oriented or aligned to extend from the mounted mating end 216 towards at least one electrical package 204 and at least partially across a top surface 228 of the electrical package(s) 204. For example, the terminal 212 extends across the first edge 226 of the electrical package(s) 204 and, either the terminal 212 or the cable 214 coupled thereto, extends beyond a second, opposite edge 230 of the electrical package(s) 204. The terminating segment 218 of the terminal 212, therefore, is positioned over the top surface 228 of the electrical package(s) 204. The terminating segment 218 may make direct physical (e.g., mechanical) contact with the top surface 228 of the electrical package(s) 204. In an alternative embodiment, the terminating segment 218 may be disposed slightly above the top surface 228 without physically contacting the surface 228. For example, the terminating segment 218 may indirectly contact the electrical package(s) 204 via a thermally conductive interface (e.g., paste, grease, adhesive, or other intermediary) placed inbetween the terminating segment 218 and the surface 228. The thermal interface may support heat transfer, allowing the terminating segment 218 to thermally couple to the electrical package 204 without direct physical contact.

The positioning of the terminating segment 218 over the electrical package(s) 204 allows the respective terminal 212 to thermally couple to the top surface 228 of the package(s) 204. As used herein, thermal coupling between two objects indicates that thermal energy in the form of heat transfers (e.g., through conduction) from one of the objects to the other in the presence of a temperature gradient. Thermally coupled objects may also transfer thermal energy through thermal radiation and/or convection. Therefore, heat generated at an electrical package 204 may be transferred to a terminating segment 218 thermally coupled to the electrical package 204. Both the terminal 212 and the center conductor 310 of the attached cable 214 are thermally conductive and create a crimp sink, so heat received by the terminal 212 dissipates from terminal 212 through the cable 214 and away from the heat-generating electrical package 204. The conduction of the heat away from the electrical package 204 cools the electrical package 204. Additionally, the cable 214 may extend out of the connector housing 112 (shown in FIG. 1) itself, since the cable 214 may be used as a conductor between the connector 104 (shown in FIG. 1) and an external device (e.g., power source 106, control module 108, electrical load 102, and the like). Therefore, at least some of the heat conducted through the cable 214 dissipates outside of the housing 112 (e.g., into ambient conditions), effectively cooling the interior of the housing 112.

In an exemplary embodiment, at least one terminal 212 thermally engages each electrical package 204 disposed on the substrate 202. In the illustrated embodiment having two electrical packages 204A and 204B, the terminal 212A extends across the first electrical package 204A; the terminal 212C extends across the second electrical package 204B; and the middle terminal 212B extends over a gap 232 between the first and second electrical packages 204A, 204B and at least partially across edges of both electrical packages 204A, 204B. Alternatively, the middle terminal 212B may be positioned to extend across only the first or the second electrical package 204A, 204B instead of splitting the gap 232 between them (e.g., to increase the thermal transfer area of the corresponding terminating segment 218).

Figure 3:
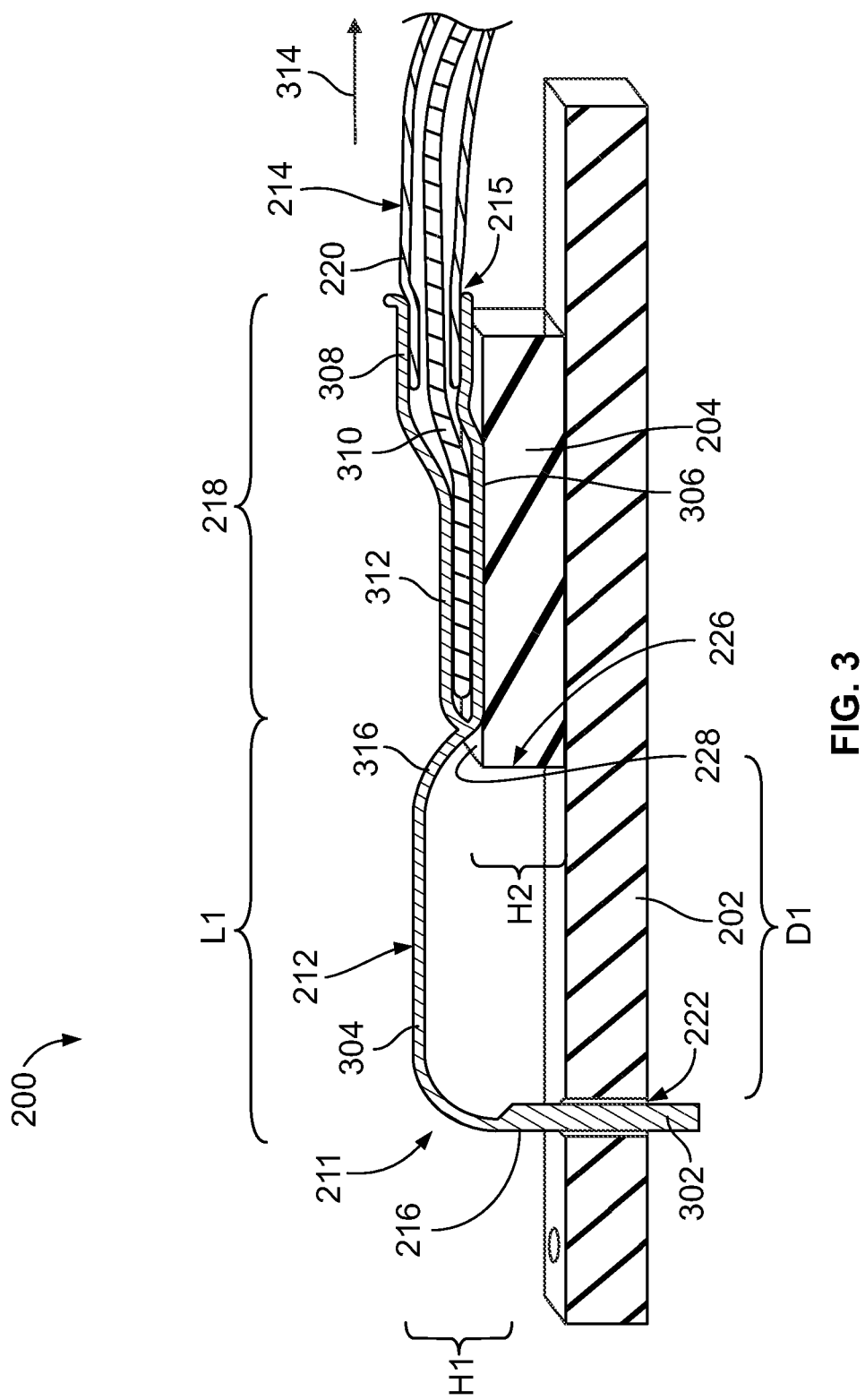
FIG. 3 is a cross-section of the electrical assembly shown in FIG. 2 according to an exemplary embodiment.

FIG. 3 is a cross-section of the electrical assembly 200 shown in FIG. 2 according to an exemplary embodiment. The cross-section is along line 3-3 of FIG. 2. In FIG. 3, the terminal 212 of the conductor 211 is mounted to the substrate 202. More specifically, the pin 302 of the mating end 216 of the terminal 212 is received in a defined hole 222 of the substrate 202. The pin 302 may be retained within the hole 222 by a mechanical interference fit, by an adhesive or glue, by soldering, and/or the like.

The mating end 216 of the terminal 212 is connected to the terminating segment 218 by an arm 304. The arm 304 mechanically and electrically couples the mating end 216 to the terminating segment 218 to allow the transmission of electrical signals through the length of the terminal 212 between the substrate 202 and the cable 214. In an exemplary embodiment, the arm 304 may be curved or angled roughly 90 degrees such that the mating end 216 is generally perpendicular to the terminating segment 218. Alternatively, if the mating end 216 is soldered to the surface of the substrate 202 instead of through-hole mounted, the mating end 216 may be flat on the surface and not perpendicular to the terminating segment 218. The arm 304 is curved to allow the terminating segment 218 to be oriented generally parallel to the top surface 228 of the electrical package 204. The parallel orientation increases the thermal transfer area between the terminating segment 218 and the package 204 (e.g., as opposed to the terminating segment 218 having an angular orientation relative to the surface 228 of the package 204). As well as having a length L1 to span the distance D1 between where the mating end 216 mounts to the substrate 202 and the edge 226 of the electrical package 204, the arm 304 may also be configured with a height H1. The height H1 of the arm 304 may be configured to account for the height H2 of the electrical package 204 to allow the terminating segment 218 to thermally engage the top surface 228 of the package 204.

As stated above with reference to FIG. 2, the terminating segment 218 may be in physical contact with the electrical package 204, either directly or indirectly through a thermal interface device/material. In an exemplary embodiment, the terminal 212 is shaped such that, when mounted to the substrate 202 at the mating end 216, the terminating segment 218 is biased into direct contact with the top surface 228 of the package 204. The biasing force may be provided by the deflectable arm 304 that is anchored to the fixed mating end 216. For example, the arm 304 may include a downward-curved section 316 that applies a downward biasing force on the terminating segment 218. Biasing the terminating segment 218 into physical contact with the electrical package 204 supports the retention of thermal coupling between the terminal 212 and the package 204. Alternatively, or in addition, an adhesive (e.g., a thermally conductive adhesive) may be applied between the surface 228 of the package 204 and a bottom surface 306 of the terminating segment 218 to retain contact between the two surfaces 228, 306. Furthermore, the connector housing 112 (shown in FIG. 1), in which the electrical assembly 200 is mounted, may include one or more features that are configured to press on the terminating segment 218 from above to mechanically force the terminating segment 218 into continued thermal engagement with the top surface 228 of the package 204.

In addition to being thermally coupled to the electrical package 204, the terminating segment 218 is terminated to the cable 214. In an embodiment, the end 215 of the cable 214 may be crimped to the terminating segment 218. For example, the outer jacket 220 may be crimped to an insulation crimping barrel 308 of the terminating segment 218, and the center conductor 310 of the cable 214 may be crimped to a wire crimping barrel 312 of the terminating segment 218. Thus, the center conductor 310 is mechanically and electrically coupled to the terminating segment 218 of the terminal 212. In addition, the center conductor 310 is thermally engaged with the terminating segment 218 (e.g., due to the thermally conductive materials in both components), creating a crimp sink. Therefore, the heat from the electrical package 204 that is received by the terminating segment 218 of the terminal 212 is conveyed (e.g., conducted, radiated, etc.) through the center conductor 310 along the length of the cable 214. The heat is conveyed through the crimp sink away from the electrical package 204 in the direction 314 (e.g., the direction that the cable 214 extends). As the heat traverses the center conductor 310, the thermal energy dissipates from the cable 214 without substantially increasing the temperature of the center conductor 310.

Alternatively to the illustrated embodiment in FIG. 3, a crimping section of the terminating segment 218 that terminates to the cable 214 may be distinguishable from a section of the terminating segment 218 configured to thermally couple to the electrical package 204. For example, the thermal coupling section may be adjacent to the crimping section and shaped exclusively for increasing heat transfer from the package 204 to the terminal 212. However, both sections may be electrically, thermally, and mechanically joined, such that electrical signals transmitted and/or thermal energy transferred between the terminal 212 and the cable 214 would not be negatively affected.

Figure 4:
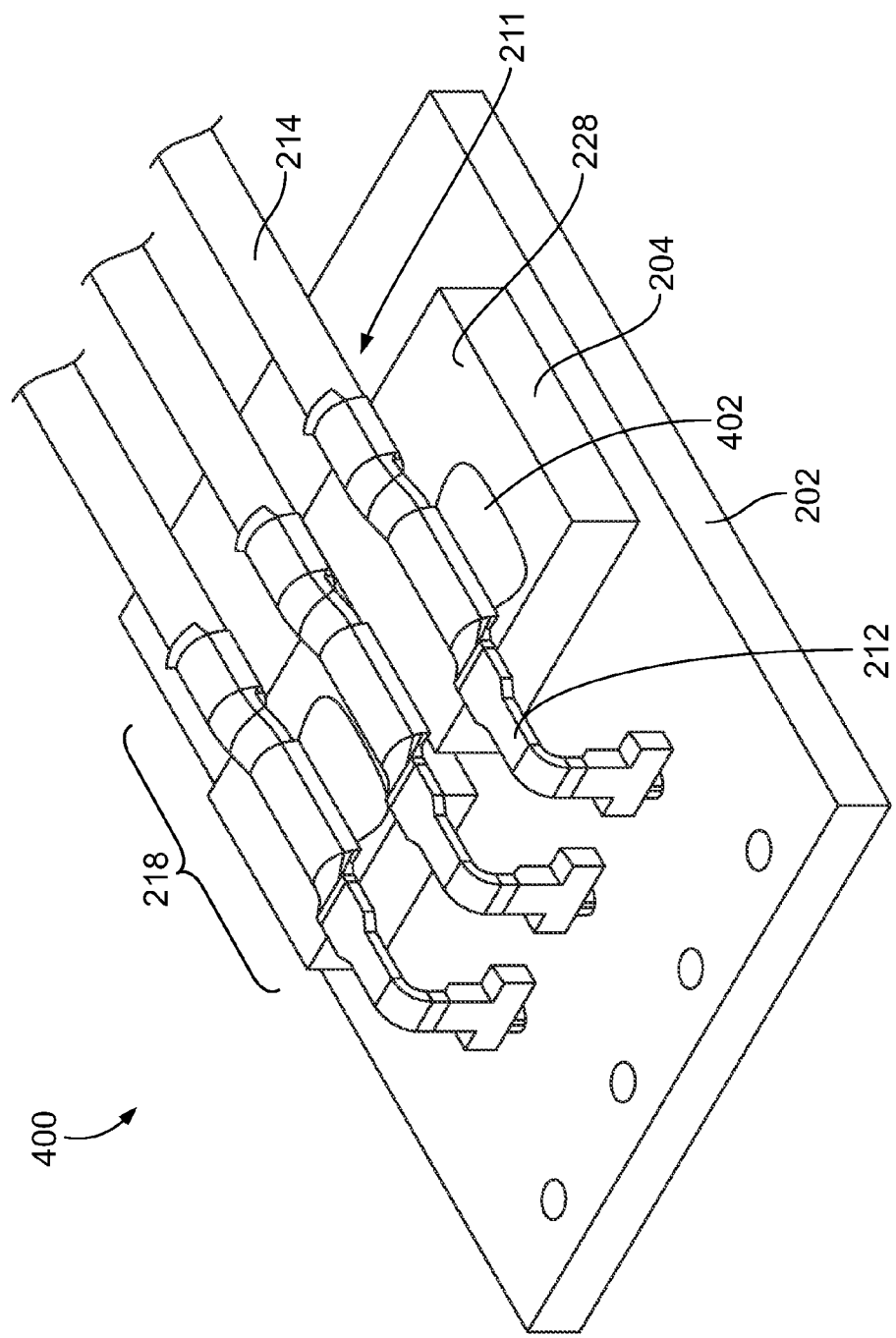
FIG. 4 is a perspective view of an electrical assembly according to an exemplary embodiment.

FIG. 4 is a perspective view of an electrical assembly 400 according to an exemplary embodiment. The electrical assembly 400 may be similar to the electrical assembly 200. Components of the electrical assembly 400 common to components of the electrical assembly 200 are similarly labeled. In the illustrated embodiment, the electrical packages 204 of the electrical assembly 200 may include identified heat transfer zones 402. The heat transfer zones 402 may be areas of the outer surfaces of the packages 204 that emit more heat than other areas of the surfaces. The heat transfer zones 402 may be identified by the manufacturer or supplier of the electrical packages 204 prior to assembly in the electrical assembly 400. Alternatively, the heat transfer zones 402 may be determined after coupling the packages 204 to the substrate 202 by measuring the heat emitted from various surfaces of the packages 204. As shown in FIG. 4, the heat transfer zones 402 are located along the top surfaces 228 of the two electrical packages 204.

In an exemplary embodiment, the terminals 212 of the conductors 211 are aligned or oriented such that at least part of the terminating segments 218 thermally couples to the identified heat transfer zones 402 of the electrical packages 204. Therefore, the heat emitted at the heat transfer zones 402 may be received by the terminating segments 218 and conveyed along the center conductors 310 (shown in FIG. 3) of the cables 214 away from the electrical packages 204. Optionally, the terminating segment 218 of each terminal 212 may be formed to have a wider base than at least some other sections of the terminal 212 in order to increase the thermal transfer area between the surface 228 of the package 204 and the terminal 212 to increase the amount of transferred thermal energy.

Optionally, the electrical assembly 400 may include a thermal interface (not shown) that is positioned between the terminals 212 and the electrical packages 204. The thermal interface may be a thermal transfer pad, a thermal transfer adhesive, a thermal transfer grease, an additional heat plate, or the like. The thermal interface may be placed over an identified heat transfer zone 402 on an electrical package 204. The thermal interface may increase the thermal transfer of heat between the package 204 and the terminal 212 by filling gaps between the top surface 228 of the package 204 and the bottom surface 306 (shown in FIG. 3) of the terminating segment 218. For example, the thermal interface may fill in gaps between the two surfaces 228, 306 to allow heat to conduct directly through the interface, which is a more efficient form of heat transfer between two surfaces than convection or radiation through air (e.g., the air in the gaps between the surfaces).

In an alternative embodiment, the conductors 211 may be configured to thermally couple to one or more other surfaces of the electrical package 204 in addition to or instead of the top surface 228. For example, a terminal may be curved and/or twisted such that a terminating segment thermally engages at least one side surface of the package 204 that extends orthogonally downward from an edge of the top surface 228. In an alternative embodiment, a terminating segment may be configured to have a generally right angle crease in order for that terminating segment to thermally engage two adjacent orthogonal surfaces of the package 204.

One or more embodiments herein provide the technical effect of providing heat dissipation and cooling of electrical packages, such as semiconductor chips, on an electrical assembly in a connector housing. One or more embodiments provide the technical effect of cooling electrical packages of an electrical assembly without adding bulky or costly additional heat sinking devices. One or more embodiments provide the technical effect of cooling electrical packages of an electrical assembly that is tightly packaged within a narrow interior region of a connector housing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

What is claimed is:

1. An electrical assembly configured to be fixed in a housing of an electrical connector, the electrical assembly comprising:
   an electrical package disposed on a substrate and electrically connected to the substrate, and
   a conductor comprising a cable and a terminal terminated to the cable at a terminating segment, the terminal having a stamped and formed body extending to a mating end terminated to the substrate at a spaced apart location from the electrical package to provide at least one of power or control signals to the substrate through the mating end, wherein a thermal interface of the body of the terminal is thermally coupled to the electrical package to receive heat generated at the electrical package and to dissipate the heat to the terminating end and the cable away from the electrical package.

2. The electrical assembly of claim 1, wherein the electrical package being indirectly electrically connected to the conductor via the substrate.

3. The electrical assembly of claim 2, wherein the substrate has a first edge and an opposite second edge, the mating end of the conductor engaging and electrically connecting to the substrate between the first edge and the electrical package, and the conductor being oriented to extend across a top surface of the electrical package and beyond the second edge of the substrate.

4. The electrical assembly of claim 1, wherein the body of the terminal is stamped and formed to include a crimp barrel at the terminating end that is terminated to an end of the cable, the mating end of the terminal including a pin being terminated to the substrate.

5. The electrical assembly of claim 1, wherein the cable includes a center conductor extending at least partially over the electrical package and being thermally coupled to the electrical package through the terminal, the heat being dissipated away from the electrical package through the center conductor.

6. The electrical assembly of claim 1, wherein the conductor extends out of the housing of the electrical connector, at least some of the heat being dissipated through the conductor outside of the housing to cool an interior of the housing.

7. The electrical assembly of claim 1, wherein the terminating segment is crimped to an end of the cable and passes directly over the electrical package such that the thermal interface mechanically engages the electrical package.

8. The electrical assembly of claim 1, wherein the conductor is shaped such that the terminating segment is biased into mechanical engagement with the electrical package to retain thermal coupling between the conductor and the electrical package.

9. The electrical assembly of claim 1, wherein the thermal interface fills gaps between the conductor and the electrical package to enhance heat transfer from the electrical package to the conductor.

10. The electrical assembly of claim 9, wherein the thermal interface is at least one of a pad, an adhesive, a grease, or a heat plate.

11. The electrical assembly of claim 1, wherein the conductor is aligned such that the terminating segment thermally couples to the electrical package at identified heat transfer zones on a surface of the electrical package.

12. The electrical assembly of claim 1, wherein a plurality of electrical packages are disposed on the substrate and each electrical package is thermally coupled to at least one conductor of a plurality of conductors.

13. The electrical assembly of claim 1, wherein the electrical package is a semiconductor chip.

14. The electrical assembly of claim 1, wherein the substrate is a printed circuit board that includes defined electrical traces that convey at least one of power or control signals from the conductor to the electrical package disposed thereon.

15. An electrical assembly configured to be fixed in a housing of an electrical connector, the electrical assembly comprising:
    an electrical package disposed on a substrate and electrically coupled to the substrate, and
    a terminal terminated to a cable, the terminal having a mating end configured to electrically connect to the substrate at a spaced apart location from the electrical package, wherein at least one of power or control signals are transmitted through the terminal to the substrate from the cable, wherein a terminating segment of the terminal is at least one of crimped and soldered directly to an end of the cable, the terminal having a thermal interface thermally coupled to the electrical package to receive heat generated at the electrical package and dissipate the heat through the cable away from the electrical package.

16. The electrical assembly of claim 15, wherein the terminating segment of the terminal physically contacts the electrical package at least one of directly through direct physical contact or indirectly through a thermal interface positioned between the terminating segment and the electrical package to thermally couple the terminal to the electrical package.

17. The electrical assembly of claim 15, wherein the terminal provides the at least one of power or control signals from the cable to the electrical package indirectly via the substrate.

18. The electrical assembly of claim 15, wherein the terminal includes a stamped and formed body extending between the terminating segment and the mating end, the body defining the thermal interface of the terminal passing over the electrical package.

19. An electrical assembly configured to be disposed in a housing of an electrical connector, the electrical assembly comprising:
    a semiconductor chip disposed on a printed circuit board and electrically connected to the printed circuit board, and
    a conductor directly mechanically engaged and electrically connected to the printed circuit board at a spaced apart location from the semiconductor chip to provide at least one of power or control signals to the printed circuit board, the semiconductor chip being indirectly electrically connected to the conductor via the printed circuit board, wherein a terminating segment of the conductor is thermally coupled to the semiconductor chip to receive heat generated at the semiconductor chip and dissipate the heat through the conductor away from the semiconductor chip.

20. The electrical assembly of claim 19, wherein the terminating segment of the conductor thermally couples to the semiconductor chip by physically contacting the semiconductor chip at least one of directly through direct physical contact or indirectly through a thermal interface positioned between the terminating segment and the semiconductor chip.

* * * * *